United States Patent [19]
Horiuchi

[11] Patent Number: 5,571,745
[45] Date of Patent: Nov. 5, 1996

[54] FABRICATION METHOD OF SEMICONDUCTOR DEVICE CONTAINING N- AND P-CHANNEL MOSFETS

[75] Inventor: Tadahiko Horiuchi, Tokyo, Japan

[73] Assignee: NEC Corporation, Japan

[21] Appl. No.: 510,103

[22] Filed: Aug. 1, 1995

[30] Foreign Application Priority Data

Aug. 1, 1994 [JP] Japan .................................. 6-197161

[51] Int. Cl.⁶ .................................................. H01L 21/70
[52] U.S. Cl. ...................... 437/57; 437/34; 437/45; 437/56; 437/58; 437/29
[58] Field of Search .................... 437/34, 45, 57, 437/58, 56, 29

[56] References Cited

FOREIGN PATENT DOCUMENTS

| | | |
|---|---|---|
| 62-149163 | 7/1987 | Japan . |
| 63-54771 | 3/1988 | Japan . |
| 3-171672 | 7/1991 | Japan . |
| 4-343264 | 11/1992 | Japan . |

*Primary Examiner*—George Fourson
*Assistant Examiner*—Long Pham

[57] ABSTRACT

A fabrication method of an MOS semiconductor device through a reduced number of necessary resist mask formation steps. A patterned resist film is formed on an active region and an isolation insulator film. The resist film has a window exposing the active region and its surrounding area. First dopant ions are selectively implanted into the substrate using the patterned resist film as a mask, forming a well region of a first conductivity type. The first dopant ions penetrate through the gate electrode and the gate insulator film into the active region and through the isolation insulator film into the surrounding area of the active region. Second dopant ions are selectively implanted into the well region using the same patterned resist film as a mask, forming a pair of source/drain regions of a second conductivity type. The second dopant ions penetrate through the gate electrode and the gate insulator film into the well region and do not penetrate through the isolation insulator film. A patterned conductor film is formed on an interlayer insulator film.

9 Claims, 5 Drawing Sheets

FABRICATION METHOD OF SEMICONDUCTOR DEVICE CONTAINING N- AND P-CHANNEL MOSFETS

BACKGROUND OF THE INVENTION

1. Field of the Invention

The present invention relates to a fabrication method of a semiconductor device, and more particularly to a fabrication method of a semiconductor device containing p- and n-channel Metal-Oxide-Semiconductor Field-Effect Transistors (MOSFETs) which reduces the number of necessary photolithography process steps.

2. Description of the Prior Art

The complementary MOS (CMOS) structure is suitable for realizing denser integrated circuit devices (ICs) due to its minimized power consumption. For this reason, recently, almost all MOS ICs have had the CMOS structure.

An MOS IC having the CMOS structure, i.e., a CMOS IC, requires n-channel MOSFETs and p-channel MOSFETs provided on a silicon substrate.

Conventionally, CMOS ICs having the single well or tub structure have been fabricated. However, CMOS ICs having the twin well or tub structure have become popular because the twin tub structure enables optimization of the dopant concentration for both the n- and p-channel MOSFETs.

With the CMOS IC having the twin tub structure, (a) well formation, (b) threshold-voltage adjustment or channel doping, and (c) source/drain formation process step are required for each of the n- and p-channel MOSFETs, and each of the steps contains an impurity doping process. If each of the impurity doping process steps is done by lithography and subsequent ion-implantation techniques, each of the n- and p-channel MOSFETs needs two mask formation process steps. Therefore, the number of the necessary process steps for mask formation is six.

Also, to produce each of the n- and p-channel MOSFETs, (d) isolation oxide formation, (e) gate electrode formation, (f) contact hole formation, and (g) Aluminum (Al) interconnection film formation process steps are required, each of which needs a single photolithography process. Therefore, the total number of the necessary mask formation process steps is four for each of the n- and p-channel MOSFETs.

As a result, the total number of necessary mask formation process steps in CMOS IC fabrication is ten, which is specifically described below.

(1) P-well Formation Photolithography: A first photoresist film is formed and is patterned to selectively cover a PMOS active region where a p-channel MOSFET is formed. Then, a p-impurity is selectively ion-implanted into a semiconductor substrate to form a p-well region using the patterned first photoresist film as a mask.

(2) N-well Formation Photolithography: A second photoresist film is formed and is patterned to selectively cover an NMOS active region where an n-channel MOSFET is formed. Then, an n-impurity is selectively ion-implanted into the semiconductor substrate to form an n-well region using the patterned second photoresist film as a mask.

(3) Isolation Photolithography: After a silicon nitride film is formed on the entire substrate, a third photoresist film is formed on the silicon nitride film to be patterned so that it selectively covers the PMOS and NMOS active regions and exposes an isolation region. Then, the substrate is thermally and selectively oxidized using the patterned third photoresist film as a mask, resulting in an isolation oxide film on the isolation region.

(4) P-well Threshold Adjustment Photolithography: A fourth photoresist film is formed and is patterned to selectively cover the PMOS active region. Then, a p-impurity is selectively ion-implanted into the p-well region to adjust the threshold voltage of the n-channel MOSFET using the patterned fourth photoresist film as a mask.

(5) N-well Threshold Adjustment Photolithography: A fifth photoresist film is formed and is patterned to selectively cover the NMOS active region. Then, an n-impurity is selectively ion-implanted into the n-well region to adjust the threshold voltage of the p-channel MOSFET using the patterned fifth photoresist film as a mask.

(6) Gate Electrode Formation Photolithography: After a gate oxide film is selectively formed on the PMOS and NMOS active regions, a polysilicon film is deposited on the gate oxide film. A sixth photoresist film is formed on the polysilicon film to be patterned so that it selectively covers the channel regions of the n- and p-channel MOSFETs. Then, the polysilicon film is etched to form gate electrodes for the n- and p-channel MOSFETs using the patterned sixth photoresist film as a mask.

(7) N-Source/drain Region Formation Photolithography: A seventh photoresist film is formed to be patterned so that it selectively exposes the NMOS active region and a contact region for the n-well region. Then, an n-impurity is selectively ion-implanted into the substrate to form a pair of n-source/drain regions in the NMOS active region and an $n^+$-diffusion region in the PMOS region using the patterned seventh photoresist film as a mask.

(8) P-Source/drain Region Formation Photolithography: An eighth photoresist film is formed to be patterned so that it selectively exposes the PMOS active region and a contact region for the p-well region. Then, a p-impurity is selectively ion-implanted into the substrate to form a pair of p-source/drain regions in the PMOS active region and a $p^+$-diffusion region in the NMOS active region using the patterned eighth photoresist film as a mask.

(9) Contact Hole Formation Photolithography: After an interlayer insulator film is formed to cover the entire substrate, a ninth photoresist film is formed on the interlayer insulator film to be patterned so that it has contact holes that expose the n- and p-source/drain regions and the $n^+$- and $p^+$-diffusion regions.

(10) Interconnection Formation Photolithography: After an aluminum interconnection film is formed on the interlayer insulator film, a tenth photoresist film is formed on the interconnection film to be patterned so that it provides predetermined electrical interconnections. The patterned interconnection film is contacted with the n- and p-source/drain regions and the $n^+$- and $p^+$-diffusion regions, respectively.

As described above, the conventional standard fabrication method of the semiconductor device of the CMOS structure requires a lot of photoresist formation and patterning process steps, resulting in a complicated process sequence and necessary long development and fabrication periods, which leads to an increase in fabrication costs.

To solve the problems of the conventional standard fabrication method, various researches and proposals have been made to reduce the number of photoresist films.

A first conventional improved method was disclosed in the Japanese Non-Examined Patent Publication No. 4-343264 published in November 1992. In this method, a patterned photoresist film for n-well formation is used for a mask for a subsequent process of selective formation of a silicon dioxide (SiO$_2$) film. The SiO$_2$ film is obtained by the Liquid-Phase Epitaxy (LPE) technique. A p-well region is selectively formed in a semiconductor substrate using the selectively formed SiO$_2$ film as a mask. This method results in the number of the patterned photoresist film formation steps being reduced by one.

A second conventional improved method was disclosed in the Japanese Non-Examined Patent Publication No. 3-171672 published in July 1991. In this method, a patterned photoresist film for n- or p-well formation is used for a mask for a subsequent process of threshold adjustment. An ion-implantation process for the well formation is performed at an acceleration energy that enables impurity ions to penetrate an isolation oxide film. The number of the patterned photoresist film formation steps can be reduced by two in this method.

A third conventional improved method was disclosed in the Japanese Non-Examined Patent Publication No. 62-149163 published in July 1987. In this method, a patterned photoresist film for n- or p-well formation is used for a mask for a subsequent process of source/drain formation. This method is specifically explained below referring to FIGS. 1A to 1E attached.

Figure 1A:
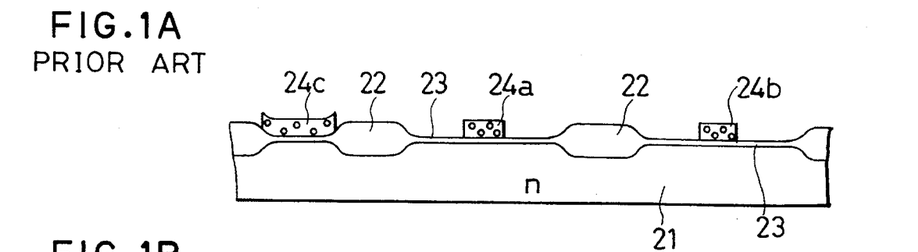
FIGS. 1A to 1E are partial cross-sectional views showing a conventional fabrication method of a semiconductor device, respectively.

First, as shown in FIG. 1A, an isolation oxide film 22 is selectively formed on an n-silicon substrate 21 by the LOCal Oxidation of Silicon (LOCOS) technique, defining an NMOS active region for an n-channel MOSFET and a PMOS active region for a p-channel MOSFET. A gate oxide film 23 is formed on the NMOS and PMOS active regions. Gate electrodes 24a and 24b are formed on the gate oxide film 23 in the NMOS and PMOS active regions, respectively. To control an electric potential of a p-well region, i.e., a p-well potential, a patterned mask 24c is formed on the gate oxide film 23 in the NMOS active region. This mask 24c is made of the same material as that of the gate electrodes 24a and 24b and is formed during the same gate-formation process.

Figures 1B, 1C:
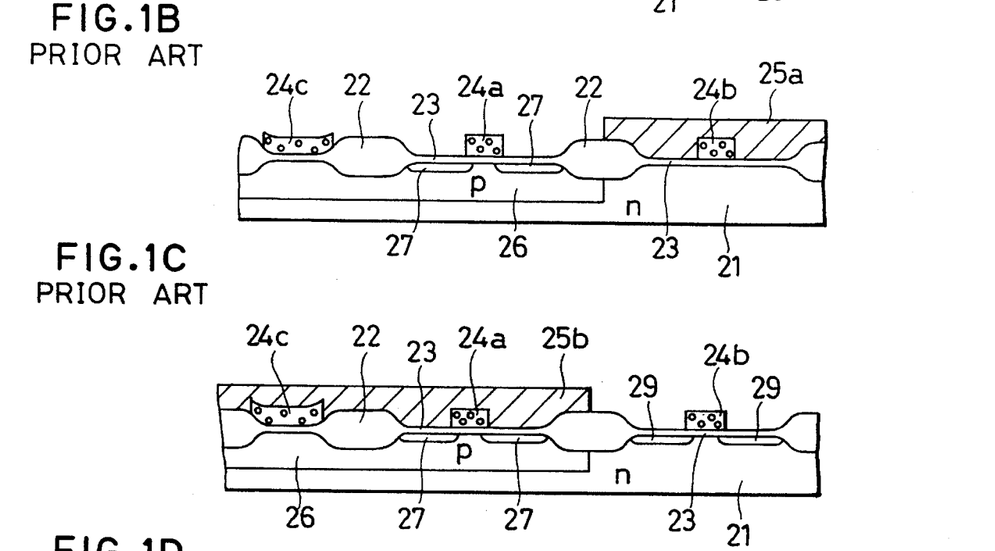

Next, as shown in FIG. 1B, a photoresist film 25a is formed over the substrate 21 and is patterned to selectively expose the NMOS active region. Then, a p-impurity is selectively ion-implanted into the substrate 21 to form a p-well region 26 using the patterned photoresist film 25a as a mask.

Then, a p-impurity is selectively ion-implanted into the channel region to adjust the threshold voltage of the n-channel MOSFET, which is termed a channel doping process. An n-impurity is selectively ion-implanted into the substrate 21 to form a pair of n-source/drain regions 27 in the NMOS active region, i.e., the p-well region 26.

Next, as shown in FIG. 1C, a photoresist film 25b is formed over the substrate 21 and is patterned to selectively expose the PMOS active region. Then, an n-impurity is selectively ion-implanted into the substrate 21 to adjust the threshold voltage of the p-channel MOSFET. A p-impurity is selectively ion-implanted into the n-substrate 21 to form a pair of p-source/drain regions 29 in the PMOS active region.

Figure 1D:
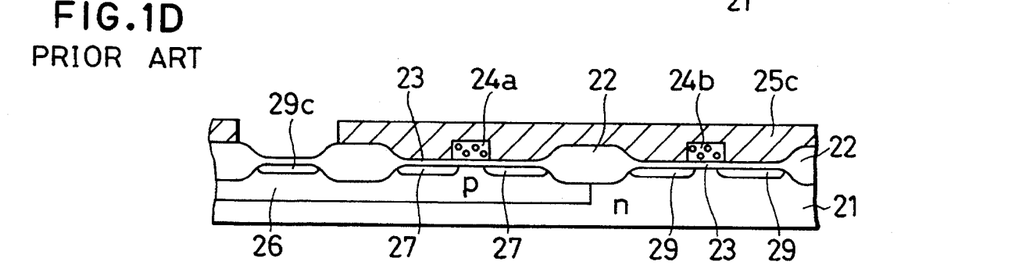

As shown in FIG. 1D, a photoresist film 25c is formed over the substrate 21 and is patterned to selectively expose the mask 24c. Then, the mask 24c is etched away using the photoresist film 25c as a mask, and a p-impurity such as boron (B) is selectively ion-implanted into the p-well region 26 to form a p$^+$-diffusion region 29c. The region 29c is used for controlling or fixing the well potential of the p-well region 26.

Figure 1E:
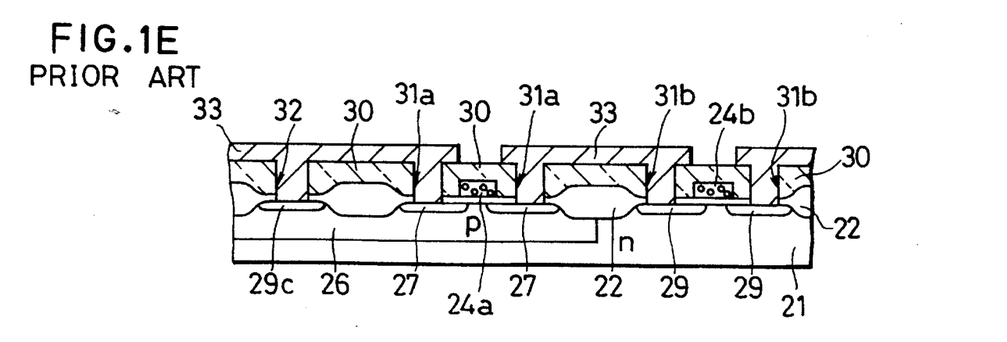

As shown in FIG. 1E, an interlayer insulator film 30 is then deposited to cover the entire substrate 21 and is patterned to form penetrating contact holes 31a, 31b and 32. The contact holes 31a exposes the pair of n-source/drain regions 27 for the n-channel MOSFET. The contact holes 31b expose the pair of p-source/drain regions 29 for the p-channel MOSFET. The contact hole 32 exposes the p$^+$-diffusion region 29c.

Finally, an Al film is deposited on the interlayer insulator film 30 to be patterned, resulting in an interconnection or wiring film 33. The film 33 is contacted with the pair of n-source/drain regions 27 through the contact holes 31a, with the pair of p-source/drain regions 29 through the contact holes 31b, and with the p$^+$-diffusion region 29c through the contact hole 32.

As described above, the third conventional improved method disclosed in the Japanese Non-Examined Patent Publication No. 62-149163 requires seven photoresist film formation process steps, i.e., (1) isolation, (2) gate electrode formation, (3) n-source/drain formation, (4) p-source/drain formation, (5) ion-implantation mask formation, (6) contact hole formation, and (7) interconnection formation.

Compared with the above conventional standard method, the first conventional improved method reduces the number of the necessary photoresist film formation process steps by only one, and the second conventional improved method reduces the number by only two.

Even with the third conventional improved method shown in FIGS. 1A to 1E, seven photoresist film formation process steps are necessary. Also, this method has a problem that no n$^+$-diffusion region for controlling or fixing the substrate potential can be formed at the top surface of the substrate 21 and that no n-well region is provided in the substrate 21, which means the single-well structure.

Therefore, in the third conventional improved method, the substrate potential needs to be fixed to a predetermined value at the bottom or back surface of the substrate 21. However, this causes the tendency for the substrate potential of the p-channel MOSFET to fluctuate due to noises or the like, resulting in unstable operation and/or latch-up of the n- and p-channel MOSFETs.

Further, to realize the double-well or twin-tub structure, an n-well region may be formed in the substrate 21 by using the same process as used for the p-well region 26. However, another problem is that the potential of the n-well region becomes more unstable occurs. To solve this problem, the n-well region is required to be produced by using the same process as used for forming the p$^+$-diffusion region 29c in the p-well region 26. This means that the number of the necessary photoresist film formation steps increases by one and consequently, the number becomes eight in total.

SUMMARY OF THE INVENTION

Accordingly, an object of the present invention is to provide a fabrication method of a semiconductor device that can result in a semiconductor device having an MOS structure through a reduced number of necessary resist mask formation steps.

Another object of the present invention is to provide a fabrication method of a semiconductor device that can result in a semiconductor device having a CMOS structure through a reduced number of necessary resist mask formation steps.

Still another object of the present invention is to provide a fabrication method of a semiconductor device that controls a well potential through the surface of a semiconductor substrate.

According to a first aspect of the present invention, a fabrication method of a semiconductor device having the MOS structure is provided, which includes the following steps:

An isolation insulator film is selectively formed on a semiconductor substrate to define an active region where an MOSFET is formed. A gate insulator film is formed on the active region and a gate electrode is formed on the gate insulator film.

A patterned resist film is formed on the active region and the isolation insulator film. The resist film has a window that exposes the active region and its surrounding area.

First dopant ions of a first conductivity type are selectively implanted into the substrate using the patterned resist film as a mask, forming a well region of the first conductivity type in the substrate. The first dopant ions penetrate through the gate electrode and the gate insulator film into the active region and through the isolation insulator film into the surrounding area of the active region.

Second dopant ions of a second conductivity type are selectively implanted into the well region using the patterned resist film as a mask, forming a pair of source/drain regions of the second conductivity type in the well region. The second dopant ions penetrate through the gate electrode and the gate insulator film into the well region and do not penetrate through the isolation insulator film.

After removing the resist film, an interlayer insulator film is formed to cover the active region having the pair of source/drain regions and the isolation insulator film.

First contact holes that penetrate the interlayer insulator film and the underlying gate insulator film and a second contact hole that penetrates the interlayer insulator film and the underlying isolation insulator film are formed.

A patterned conductor film is formed on the interlayer insulator film. The conductor film is contacted with the pair of source/drain regions through the first contact holes and with the well region through the second contact hole.

With the method according to the first aspect, the patterned resist film is used for both forming the well region by implantation of the first dopant ions and forming the pair of source/drain regions by implantation of the second dopant ions. Therefore, a semiconductor device having the MOS structure can be fabricated through a reduced number of necessary resist mask formation steps.

Also, since the patterned conductor film is contacted with the well region through the second contact hole, the well potential can be controlled through the surface of the semiconductor substrate.

According to a second aspect of the present invention, a fabrication method of a semiconductor device having the CMOS structure is provided, which includes the following steps:

An isolation insulator film is selectively formed on a semiconductor substrate to define a first active region where a first MOSFET is formed and a second active region where a second MOSFET is formed. A gate insulator film is formed on the first and second active regions. A first gate electrode is formed on the gate insulator film over the first active region. A second gate electrode is formed on the gate insulator film over the second active region.

A first patterned resist film is formed over the substrate. The first resist film has a first window that exposes the first active region and its surrounding area.

First dopant ions of a first conductivity type are selectively implanted into the substrate using the first resist film as a mask, forming a first well region of the first conductivity type in the substrate. The first dopant ions penetrate through the first gate electrode and the gate insulator film into the first active region and through the isolation insulator film into the surrounding area of the first active region.

Second dopant ions of a second conductivity type are selectively implanted into the first well region using the first resist film as a mask, forming a first pair of source/drain regions of the second conductivity type in the first well region. The second dopant ions penetrate through the first gate electrode and the gate insulator film into the first well region and do not penetrate through the isolation insulator film.

After removing the first resist film, a second patterned resist film is formed over the substrate. The second resist film has a second window that exposes the second active region and its surrounding area.

Third dopant ions of the second conductivity type are selectively implanted into the substrate using the second resist film as a mask, forming a second well region of the second conductivity type in the substrate. The third dopant ions penetrate through the second gate electrode and the gate insulator film into the second active region and through the isolation insulator film into the surrounding area of the second active region.

Fourth dopant ions of the first conductivity type are selectively implanted into the second well region using the second resist film as a mask, forming a second pair of source/drain regions of the first conductivity type in the second well region. The fourth dopant ions penetrate through the second gate electrode and the gate insulator film into the second well region and do not penetrate through the isolation insulator film.

After removing the second resist film, an interlayer insulator film is formed to cover the first and second active regions having the first and second pairs of source/drain regions and the isolation insulator film.

First contact holes that penetrate the interlayer insulator film and the underlying gate insulator film are formed over the first active region. Second contact holes that penetrate the interlayer insulator film and the underlying gate insulator film are formed over the second active region. A third contact hole that penetrates the interlayer insulator film and the underlying isolation insulator film is formed over the first well region. A fourth contact hole that penetrates the interlayer insulator film and the underlying isolation insulator film is formed over the second well region.

A patterned conductor film is formed on the interlayer insulator film. The conductor film is contacted with the first pair of source/drain regions of the second conductivity type through the first contact holes, with the second pair of source/drain regions of the first conductivity type through the second contact holes, with the first well region through the third contact hole, and with the second well region through the fourth contact hole.

With the method according to the second aspect, the first patterned resist film is used for both forming the first well region by implantation of the first dopant ions and forming the first pair of source/drain regions by implantation of the second dopant ions, and the second patterned resist film is used for both forming the second well region by implantation of the third dopant ions and forming the second pair of source/drain regions by implantation of the fourth dopant ions.

Therefore, a semiconductor device having the CMOS structure can be fabricated through a reduced number of necessary resist mask formation steps.

Also, since the patterned conductor film is contacted with the first well region through the third contact hole, and is contacted with the second well region through the fourth contact hole, the well potentials of the first and second well regions can be controlled through the surface of the semiconductor substrate.

According to a third aspect of the present invention, a fabrication method of a semiconductor device having the CMOS structure is provided, which is the same as that of the second aspect other than that the second patterned resist film is replaced by a mask insulator film. The mask insulator film is selectively grown over the substrate using the first resist film as a mask. The first resist film is removed after the formation of the mask insulator film. The mask insulator film has a second window that exposes the second active region and its surrounding area.

Therefore, with the method of the third aspect, the number of necessary resist mask formation processes is smaller by one than the case of the second aspect.

As the mask insulator film, an $SiO_2$ film is preferably used. However, any other insulator film may be used if it has the same mask function.

DETAILED DESCRIPTION OF THE PREFERRED EMBODIMENTS

Preferred embodiments of the present invention will be described below while referring to the drawings attached.

FIRST EMBODIMENT

A fabrication method of a semiconductor device according to a first embodiment is shown in FIGS. 2A to 2F.

Figure 2A:
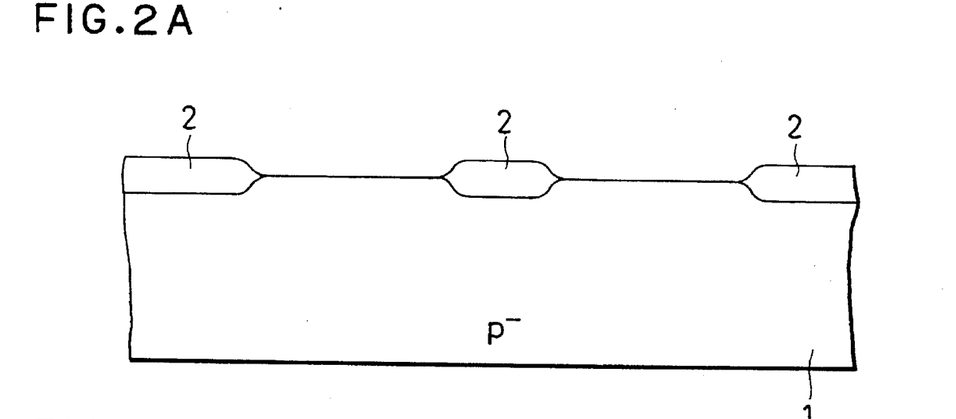
FIGS. 2A to 2F are partial cross-sectional views showing a fabrication method of a semiconductor device according to a first embodiment of the invention, respectively.

First, as shown in FIG. 2A, an isolation oxide ($SiO_2$) film 2 having a thickness of 400 to 600 nm is selectively formed on a chief surface of a lightly-doped p-silicon substrate 1 by the LOCOS technique, defining an NMOS active region where an n-channel MOSFET is formed and a PMOS active region where a p-channel MOSFET is formed.

Figure 2B:
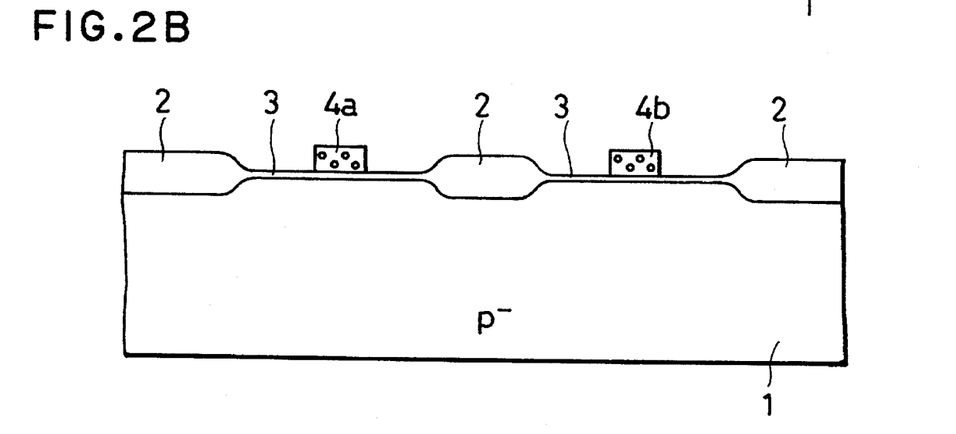

Next, as shown in FIG. 2B, a gate oxide ($SiO_2$) film 3 having a thickness of 15 to 25 nm is formed on the NMOS and PMOS active regions by thermal oxidation of the $p^-$-substrate 1.

Then, a polysilicon film having a thickness of 300 to 400 nm is deposited on the isolation oxide film 2 and the NMOS and PMOS active regions. The polysilicon film is patterned by photolithography and dry etching techniques to produce gate electrodes 4a and 4b on the gate oxide film 3. The gate electrode 4a is placed over the NMOS active region. The gate electrode 4b is placed over the PMOS active region.

Any refractory metal silicide or polycide may be used instead of polysilicon as the gate electrode material.

Figure 2C:
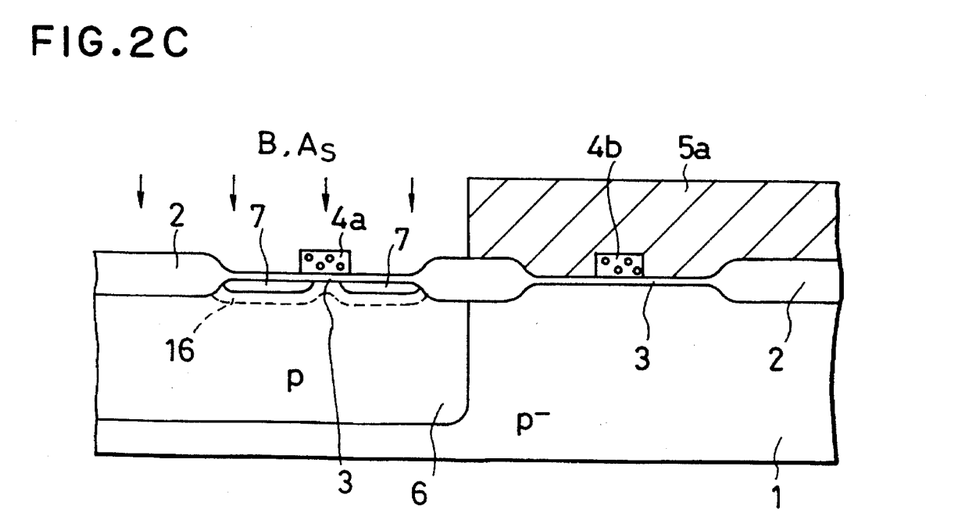

Subsequently, as shown in FIG. 2C, a photoresist film 5a having a thickness of 2.5 μm is formed over the substrate 1 and is patterned to selectively expose the NMOS active region and its surrounding area. As shown in FIG. 2C, the surrounding area contains a part of the isolation oxide film 2.

Using the patterned photoresist film 5a as a mask, boron as a p-impurity is selectively ion-implanted into the substrate 1 or NMOS active region at an acceleration energy of 400 keV with a dose of $5\times10^{13}$ atoms/cm$^2$. Since the acceleration energy is as high as 400 keV, the boron ions can pass through not only the gate electrode 4a and the underlying thin gate oxide film 3 in the NMOS active region but also the thick isolation oxide film in the surrounding area of the NMOS active region. The implantation depth becomes large due to the high acceleration energy. As a result, a p-well region 6 is selectively formed in the substrate 1, as shown in FIG. 2C.

Subsequently, using the same patterned photoresist film 5a as a mask, boron is selectively ion-implanted into the substrate 1 again at an acceleration energy of 60 keV with a dose of $1\times10^{13}$ atoms/cm$^2$ for channel doping. Since acceleration energy is as low as 60 keV, the boron ions can pass through only the gate electrode 4a and the underlying gate oxide film 3 in the NMOS active region. Thus, a p-ion-implanted region 16 is formed in the p-well region 6, as shown in FIG. 2C.

The threshold voltage of the n-channel MOSFET is adjusted to a predetermined value by the implanted boron atoms into the channel region that is under the gate electrode 4a. At the same time, a parasitic MOSFET is prevented from occurring by the boron atoms implanted into the area that is placed near the isolation oxide film 2.

Although two steps of the ion implantation process of boron are performed here, the boron implantation process may be performed several times under different implantation conditions as required. For example, three objects or purposes for the p-well region formation, the parasitic MOSFET prevention and the threshold adjustment may be accomplished by three ion-implantation process steps that are optimized for the corresponding objects.

Next, using the same photoresist film 5a as a mask, arsenic (As) as an n-impurity is selectively ion-implanted into the p-well region 6 at an acceleration energy of 50 keV and at a dose of $2\times10^{15}$ atoms/cm$^2$. Since the acceleration energy is as low as 50 keV, the arsenic ions can pass through only the gate oxide film 3. Thus, a pair of n-diffusion regions 7 acting as source/drain regions of the n-channel MOSFET are formed in the p-well region 6 in self-alignment to the gate electrode 4a, as shown in FIG. 2C.

Figure 2D:
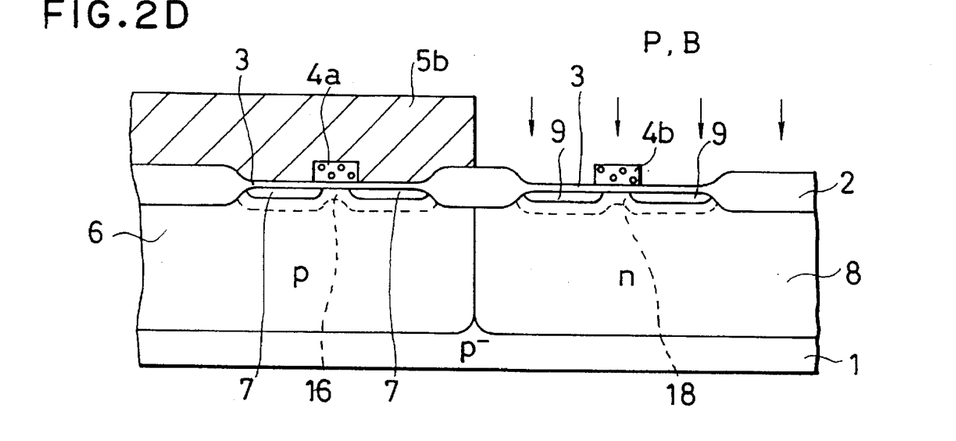

After the photoresist film 5a is removed, another photoresist film 5b, having a thickness of 2.5 μm, is formed over the substrate 1 and is patterned to selectively expose the PMOS active region and its surrounding area. As shown in FIG. 2D, the surrounding area contains a part of the isolation oxide film 2.

Using the patterned photoresist film 5b as a mask, phosphorus (P) as an n-impurity is selectively ion-implanted into the substrate 1 at an acceleration energy of 800 keV and at a dose of $5\times10^{13}$ atoms/cm$^2$. Since the acceleration energy is as high as 800 keV, the phosphorus ions can pass through not only the gate electrode 4b and the underlying thin gate oxide film 3 in the PMOS active region but also the thick isolation oxide film 2 in the surrounding area of the PMOS active region. The implantation depth becomes large due to the high acceleration energy. As a result, an n-well region 8 is selectively formed in the substrate 1 so as to adjacent to the p-well region 6, as shown in FIG. 2D.

Subsequently, using the same patterned photoresist film 5b as a mask, phosphorus is selectively ion-implanted into the substrate 1 again at an acceleration energy of 100 keV with a dose of $1.5 \times 10^{13}$ atoms/cm$^2$ for channel doping. Since the acceleration energy is as low as 100 keV, the phosphorus ions can pass through only the gate electrode 4b and the underlying gate oxide film 3 in the PMOS active region. Thus, an n-ion-implanted region 18 is formed in the n-well region 8, as shown in FIG. 2D.

The threshold voltage of the p-channel MOSFET is adjusted to a predetermined value by the implanted phosphorus atoms into the channel region that is placed under the gate electrode 4b. At the same time, a parasitic MOSFET is prevented from occurring by the phosphorus atoms implanted into the area that is placed under the isolation oxide film 2.

Although two steps of the phosphorus ion implantation process are performed here, the phosphorus implantation process may be performed several times under different implantation conditions as required, which is similar to the above case for boron. For example, three objects or purposes of the n-well region formation, the parasitic MOSFET prevention and the threshold adjustment may be accomplished by three ion-implantation process steps that are optimized for the corresponding objects.

Next, using the same photoresist film 5b as a mask, boron as a p-impurity is selectively ion-implanted into the n-well region 8 at an acceleration energy of 30 keV with a dose of $2 \times 10^{15}$ atoms/cm$^2$. Since the acceleration energy is as low as 30 keV, the boron ions can pass through only the gate oxide film 3. Thus, a pair of p-diffusion regions 9 acting as source/drain regions of the p-channel MOSFET are formed in the n-well region 8 in self-alignment to the gate electrode 4b, as shown in FIG. 2D.

Figure 2E:
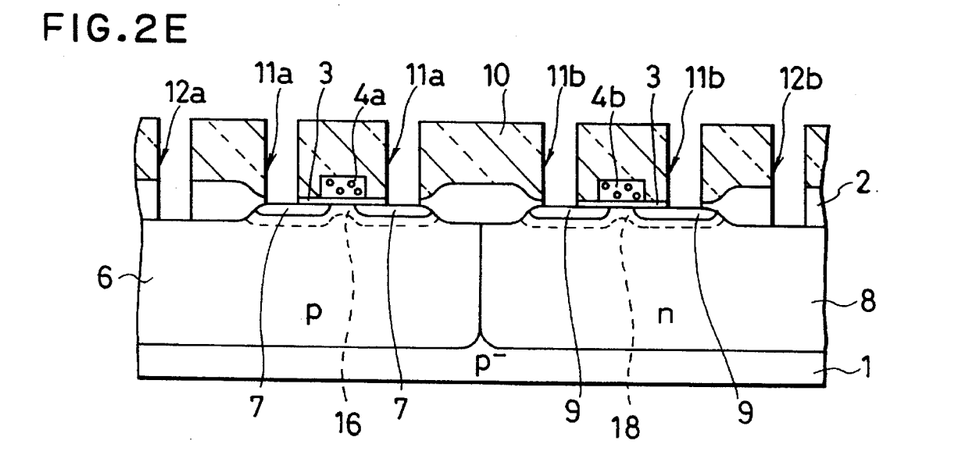

After the photoresist film 5b is removed, an interlayer insulator film 10 having a thickness of 0.8 µm is deposited over the substrate 1 by the Chemical Vapor Deposition (CVD) technique. The film 10, the gate oxide film 3 and the isolation oxide film 2 are then patterned by photolithography and dry etching techniques.

Thus, as shown in FIG. 2E, contact holes 11a which penetrate the interlayer insulator film 10 and the underlying gate oxide film 3 and expose the pair of n-source/drain regions 7 are formed over the NMOS region. Contact holes 11b which penetrate the interlayer insulator film 10 and the underlying gate oxide film 3 and expose the pair of p-source/drain regions 9 are formed over the PMOS region. A contact hole 12a which penetrates the isolation oxide film 2 and exposes the p-well region 6 is formed over the p-well region 6. A contact hole 12b which penetrates the isolation oxide film 2 and exposes the n-well region 8 is formed over the n-well region 8.

Finally, a titanium (Ti) film 15 is deposited on the patterned interlayer insulator film 10 by a sputtering technique, and is then subjected to a heat-treatment in a nitride (N$_2$) atmosphere at 700° C. for 30 seconds. During this heat-treatment, the Ti film 15 is reacted with Si so that a titanium silicide (TiSi$_2$) film 15a is formed at areas contacted with the Si substrate 1 in the contact holes 11a, 11b, 12a and 12b. On the other hand, the Ti film 15 is reacted with N$_2$ so that a titanium nitride (TiN) film 15b is formed at the remaining Ti film 15, as shown in FIG. 2F.

Figure 2F:
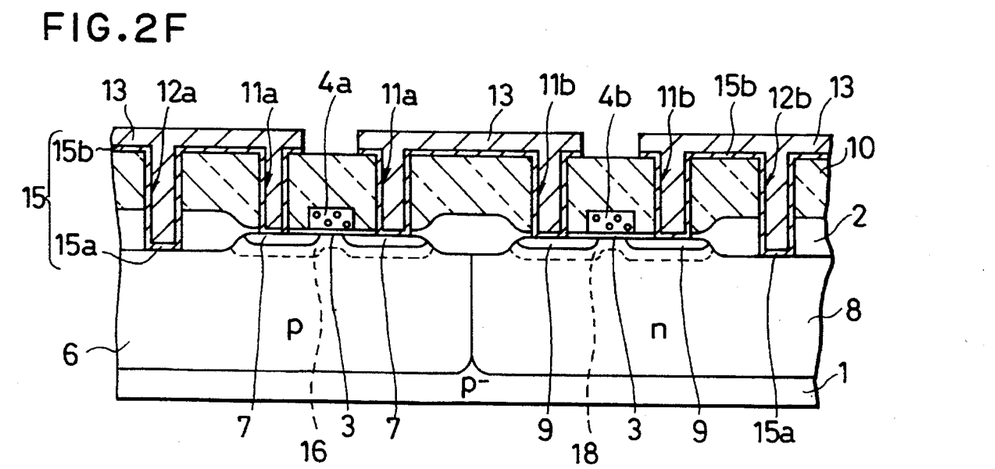

An aluminum or its alloy film 13 is deposited on the Ti film 15 by a sputtering technique, and is patterned by photolithography and etching techniques, resulting in an interconnection or wiring film, as shown in FIG. 2F. The interconnection film 13 is contacted with the TiSi$_2$ film 15a and the TiN film 15b.

The TiSi$_2$ and TiN films 15a and 15b act as a barrier for the interconnection film 13.

In the fabrication method according of the first embodiment, the photoresist film 5a is utilized for both forming the p-well region 6 and the pair of n-source/drain regions 7, and the photoresist film 5b is utilized for both forming the n-well region 8 and the pair of p-source/drain regions 9. In other words, each of the steps corresponding to FIGS. 2A to 2F requires one photoresist mask. Therefore, the number of necessary photoresist mask formation steps is six, which is smaller than the case of the conventional method shown in FIGS. 1A to 1E by one.

Additionally, because each of the photoresist films 5a and 5b is utilized for both the well formation and the source/drain formation, no p$^+$-diffusion region for controlling the p-well potential can be formed in the surface area of the p-well region 6. Similarly, no n$^+$-diffusion region for controlling the n-well potential can be formed in the surface area of the n-well region 8. This means that the well potentials of the n- and p-well regions 6 and 8 cannot be controlled effectively.

To solve this problem, with the method of the first embodiment, the contact holes 12a and 12b are formed through the isolation oxide film 2, and the TiSi$_2$ barrier film 15a is directly contacted with the n- and p-well regions 6 and 8, which are not heavily-doped with impurity. Consequently, the film 15a has Schottky contacts with the n- and p-well regions 6 and 8. In other words, the film 15a and the n- and p-well regions 6 and 8 constitute Schottky diodes, each of which has an on-state resistance of 1.5 kΩ/µm$^2$ and a turn-on voltage as low as 0.29 V in the contact holes 12a and 12b, respectively. Here, the impurity or dopant concentrations of the n- and p-well regions 6 and 8 are equal to $2 \times 10^{17}$ atoms/cm$^2$ at their surface areas placed right below the isolation oxide film 2.

Although the Schottky diode has an electronic performance that is unsuitable for flowing the drain current of an MOSFET, it sufficiently operates to control or fix the well potential that scarcely causes a current to flow. Therefore, the well potentials of the n- and p-well regions 6 and 8 can be controlled effectively through the Schottky diodes.

If the impurity concentrations of the n- and p-well regions 6 and 8 are less than $1 \times 10^{17}$ atoms/cm$^2$ at their surface area just below the isolation oxide film 2, the on-state resistance of the diodes abruptly increases, which is not preferable for the invention. Consequently, the impurity concentrations of the n- and p-wells 6 and 8 should be equal to or greater than $1 \times 10^{17}$ atoms/cm$^2$.

The TiSi$_2$ barrier film 15a is in ohmic contact with the n- and p-source/drain regions 7 and 9 because they are heavily-doped with the impurity.

SECOND EMBODIMENT

A fabrication method of a semiconductor device according to a second embodiment is shown in FIGS. 3A to 3F.

Figure 3A:
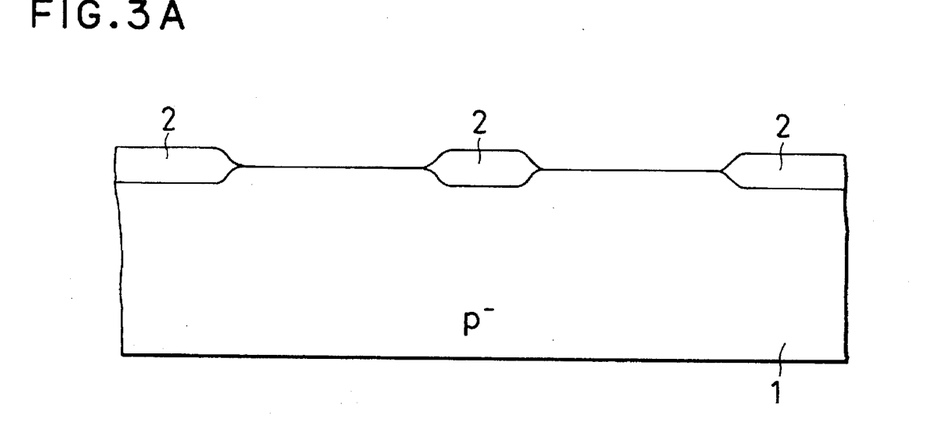
FIGS. 3A to 3F are partial cross-sectional views showing a fabrication method of a semiconductor device according to a second embodiment of the invention, respectively.

First, as shown in FIG. 3A, an isolation oxide film 2 having a thickness of 400 to 600 nm is selectively formed on a chief surface of a lightly-doped p-silicon substrate 1 by the LOCOS technique, defining an NMOS active region and a PMOS active region.

Figure 3B:
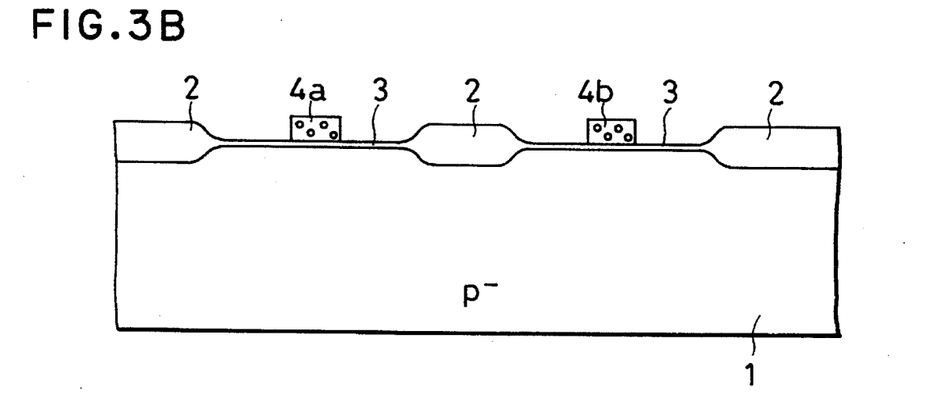

Next, as shown in FIG. 3B, a gate oxide film 3 having a thickness of 15 to 25 nm is formed on the NMOS and PMOS active regions by thermal oxidation of substrate 1.

Then, a polysilicon film having a thickness of 300 to 400 nm is deposited on the isolation oxide film 2 and the NMOS and PMOS active regions. The polysilicon film is patterned by photolithography and dry etching techniques to produce gate electrodes 4 on the gate oxide film 3.

Figure 3C:
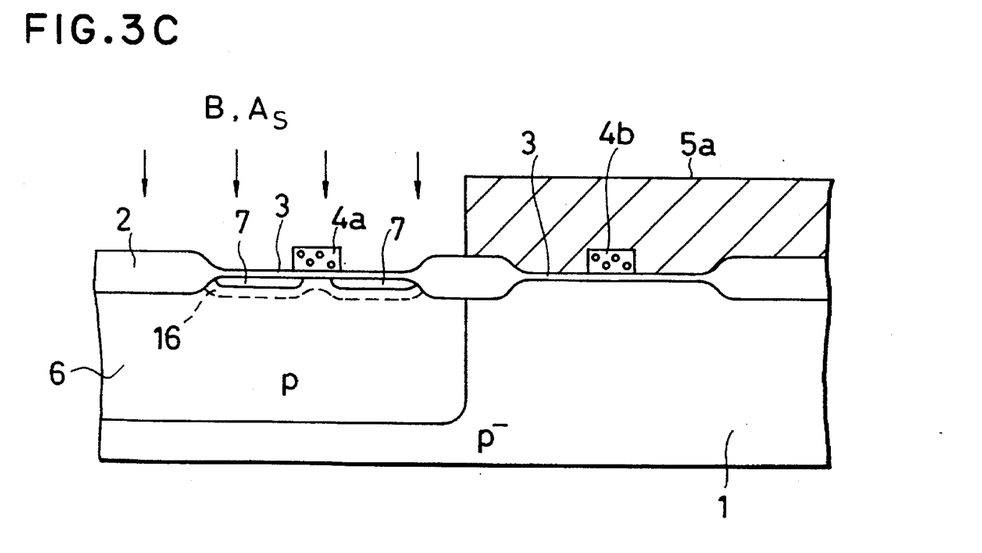

Subsequently, as shown in FIG. 3C, a photoresist film 5a having a thickness of 2.5 μm is formed over the substrate 1 and is patterned to selectively expose the NMOS active region and its surrounding area.

Using the patterned photoresist film 5a as a mask, boron is selectively ion-implanted into the substrate 1 at an acceleration energy of 400 keV and at a dose of $5\times10^{13}$ atoms/$cm^2$. Since the acceleration energy is as high as 400 keV, the boron ions can pass through not only the gate electrode 4a and the underlying thin gate oxide film 3 in the NMOS active region but also the thick isolation oxide film 2. The implantation depth becomes large in the surrounding area of the NMOS active region. As a result, a p-well region 6 is selectively formed in the substrate 1.

Using the same patterned photoresist film 5a as a mask, boron is selectively ion-implanted into the substrate 1 again at an acceleration energy of 60 keV and at a dose of $1\times10^{13}$ atoms/$cm^2$ for channel doping. Since the acceleration energy is as low as 60 keV, the boron ions can pass through only the gate electrode 4a and the underlying gate oxide film 3 in the NMOS active region. Thus, an ion-implanted region 16 is formed in the p-well region 6, as shown in FIG. 3C.

The threshold voltage of the n-channel MOSFET is adjusted to a predetermined value by the implanted boron atoms in the channel region where is under the gate electrode 4a. At the same time, a parasitic MOSFET is prevented from occurring by the boron atoms implanted into the area that is placed near the isolation oxide film 2.

Although the ion implantation process of boron is performed twice here, the process may be performed several times under different implantation conditions as required, as shown in the first embodiment.

Next, using the same photoresist film 5a as a mask, arsenic is selectively ion-implanted into the p-well region 6 at an acceleration energy of 50 keV at a dose of $2\times10^{15}$ atoms/$cm^2$. Since the acceleration energy is as low as 50 keV, the arsenic ions can pass through only the gate oxide film 3. Thus, a pair of n-diffusion regions 7 acting as source/drain regions of the n-channel MOSFET are formed in the p-well region 6 in self-alignment to the gate electrode 4a, as shown in FIG. 3C.

The above process steps are the same as those in the first embodiment.

Figure 3D:
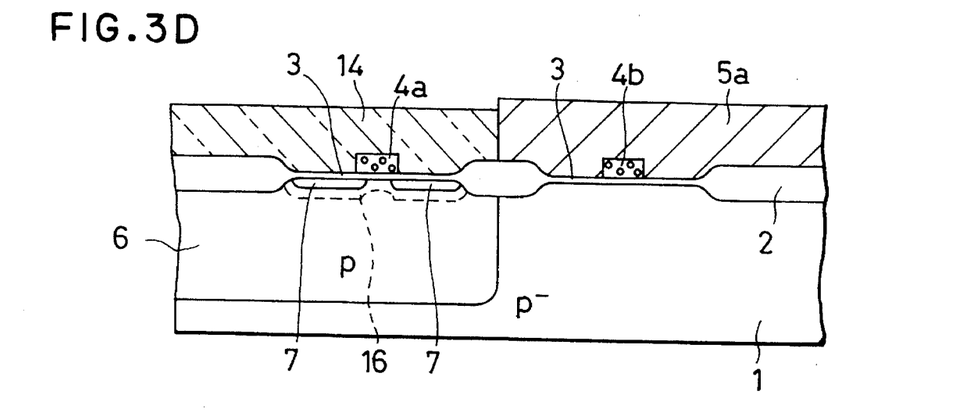

After the photoresist film 5a is removed, using the same photoresist film 5a as a mask, $SiO_2$ is selectively grown over the NMOS active region in a liquid phase, forming an $SiO_2$ film 14 having a thickness of 1.5 μm, as shown in FIG. 3D.

The selective growth of $SiO_2$ is performed by the following process steps, for example. $SiO_2$ is dissolved in silicofluoric acid ($H_2SiF_6$) to prepare a saturated solution of $SiO_2$. A water solution of boric acid ($H_3BO_3$) is added into the saturated $SiO_2$ solution to produce a supersaturated $SiO_2$ solution. $SiO_2$ is then grown in the supersaturated $SiO_2$ solution.

Using the selectively grown $SiO_2$ film 14 as a mask, phosphorus is selectively ion-implanted into the substrate 1 at an acceleration energy of 800 keV and at a dose of $5\times10^{13}$ atoms/$cm^2$. As a result, an n-well region 8 is selectively formed in the substrate 1 adjacent to the p-well region 6.

Figure 3E:
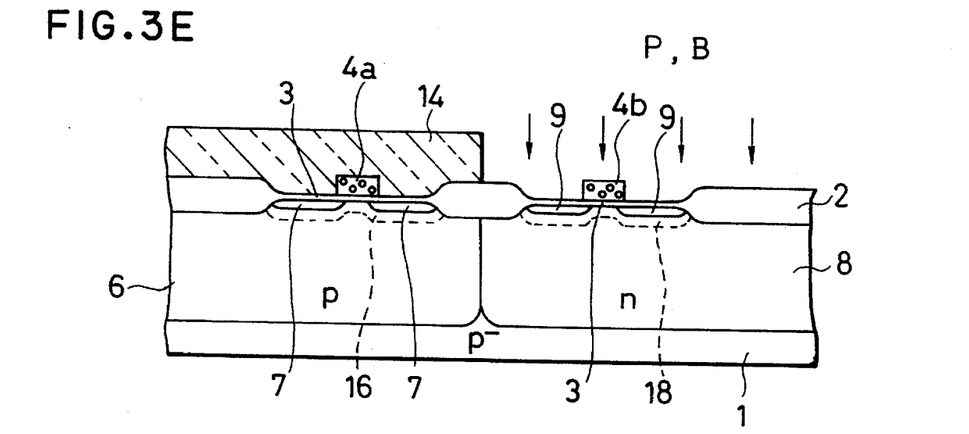

Using the same $SiO_2$ film 14 as a mask, phosphorus is selectively ion-implanted into the n-well region 8 again at an acceleration energy of 100 keV and at a dose of $1.5\times10^{13}$ atoms/$cm^2$ for channel doping. Thus, an n-ion-implanted region 18 is formed in the n-well region 8, as shown in FIG. 3E.

The threshold voltage of the p-channel MOSFET is adjusted to a predetermined value by the implanted phosphorus atoms in the channel region that is under the gate electrode 4b. At the same time, a parasitic MOSFET is prevented from occurring by the phosphorus atoms implanted in the area that is under the isolation oxide film 2.

Although the ion implantation process of phosphorus is performed twice here, the process may be performed several times under different implantation conditions as required, which is similar to the above case of the boron.

Next, using the same $SiO_2$ film 14 as a mask, boron is selectively ion-implanted into the n-well region 8 at an acceleration energy of 30 keV and at a dose of $2\times10^{15}$ atoms/$cm^2$. Thus, a pair of p-diffusion regions 9 acting as source/drain regions of the p-channel MOSFET are formed in the n-well region 8 in self-alignment to the gate electrode 4b, as shown in FIG. 3E.

Figure 3F:
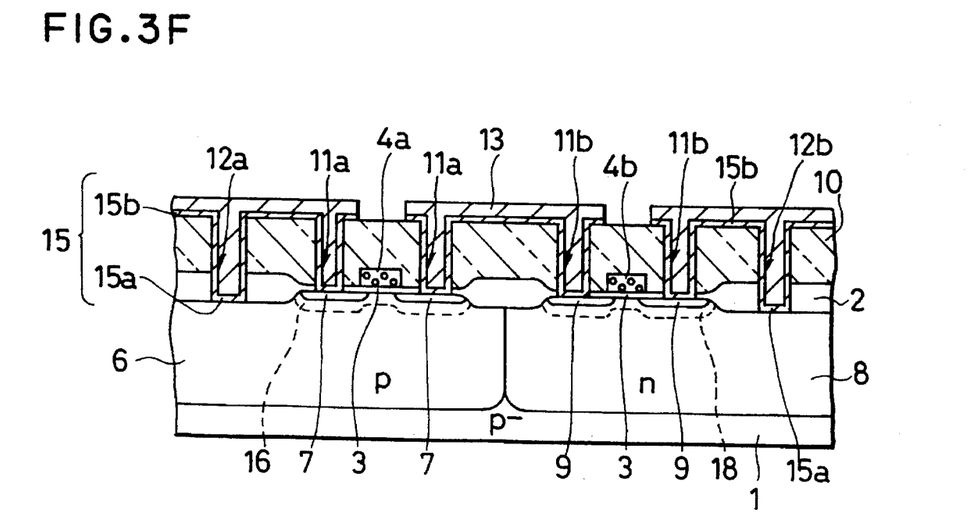

After the $SiO_2$ film 14 is removed, the same process steps as those used in the first embodiment are performed. That is, a patterned interlayer insulator film 10 is deposited over the substrate 1, as shown in FIG. 3F. Then, finally, a Ti film 15 is deposited on the patterned interlayer insulator film 10 and is subjected to a heat-treatment, resulting in $TiSi_2$ film 15a formed on the Si substrate 1 within the contact holes 11a, 11b, 12a and 12b, and a TiN film 15b, formed as the remaining film 15, as shown in FIG. 3F. An aluminum or its alloy film 13 is deposited on the film 15 to be patterned, resulting in an interconnection or wiring film 13 that is contacted with the $TiSi_2$ film 15a and the TiN film 15b, as shown in FIG. 3F.

In the fabrication method according to the second embodiment, since the selectively grown $SiO_2$ film 14 is used as a mask in the n-well region formation process, the number of necessary photoresist mask formation steps is five, which is less than that of the first embodiment by one.

While the preferred forms of the present invention have been described, it is to be understood that modifications will be apparent to those skilled in the art without departing from the spirit of the invention. The scope of the invention, therefore, is to be determined solely by the following claims.

What is claimed is:

1. A fabrication method of a semiconductor device having a CMOS structure, said method comprising the steps of:

(a) selectively forming an isolation insulator film on a semiconductor substrate to define a first active region where a first MOSFET is formed and a second active region where a second MOSFET is formed;

(b) forming a gate insulator film on said first active region and said second active region;

(c) forming a first gate electrode and a second gate electrode on said gate insulator film, said first gate electrode being placed over said first active region and said second gate electrode being placed over said second active region;

(d) forming a first patterned photoresist film over said substrate, said first photoresist film having a first window that exposes said first active region and a surrounding area of said first active region;

(e) selectively implanting first dopant ions of a first conductivity type into said substrate using said first photoresist film as a mask to form a first well region of said second conductivity type in said substrate, said first dopant ions penetrating through said first gate electrode and said gate insulator film into said first active region and through said isolation insulator film into said surrounding area of said first active region;

(f) selectively implanting second dopant ions of a second conductivity type into said substrate using said first photoresist film as a mask, to form a first pair of source/drain regions of said second conductivity type in said first well region, said second dopant ions penetrating through said first well region and not penetrating through said isolation insulator film;

(g) removing said first resist film after said step (f);

(h) forming a second patterned resist film over said substrate, said second resist film having a second window that exposes said second active region and a surrounding area of said second active region;

(i) selectively implanting third dopant ions of said second conductivity type into said substrate using said second resist film as a mask to form a second well region of said second conductivity type in said substrate, said third dopant ions penetrating through said second gate electrode and said gate insulator film into said second active region and through said isolation insulator film into said surrounding area of said second active region;

(j) selectively implanting fourth dopant ions of said first conductivity type into said second well region using said second resist film as a mask to form a second pair of source/drain regions of said first conductivity type in said second well region, said fourth dopant ions penetrating through said second gate electrode and said gate insulator film into said second well region and not penetrating through said isolation insulator film;

(k) removing said second resist film after said step (j);

(l) forming an interlayer insulator film to cover said first active region having said first pairs of source/drain regions and said second active region having said second pair of source/drain regions and said isolation insulator film;

(m) forming first contact holes that penetrate said interlayer insulator film and said underlying gate insulator film over said first active region;

(n) forming second contact holes that penetrate said interlayer insulator film and said interlying gate insulator film over said second active region;

(o) forming a third contact hole that penetrates said interlayer insulator film and said underlying isolation insulator film over said first well region;

(p) forming a fourth contact hole that penetrates said interlayer insulator film and said underlying isolation insulator film over said second well region; and (q) forming a patterned conductor film on said interlayer insulator film, said conductor film being contacted with said first pair of source/drain regions of said second conductivity type through said first contact holes, with said second pair of source/drain regions of said first conductivity type through said second contact holes, with said first well region through said third contact hole, and with said second well region through said fourth contact hole.

2. The method as claimed in claim 1, further comprising a step of selectively implanting fifth dopant ions of said first conductivity type into said first well region using said first patterned resist film as a mask in order to adjust the threshold voltage of said first MOSFET; and a step of selectively implanting sixth dopant ions of said second conductivity type into said second well region using said second patterned resist film as a mask in order to adjust the threshold voltage of said second MOSFET.

3. The method as claimed in claim 1, wherein said ion-implantation step (e) for forming said first well region and said ion-implantation step (i) for forming said second well region include a dopant concentration of $1\times10^{17}$ atoms/cm$^3$ or greater at a surface area disposed right below said isolation oxide film.

4. The method as claimed in claim 1, wherein said conductor film is in Schottky contact with said first well region through said third contact hole and with said second well region through said fourth contact hole.

5. A fabrication method of a semiconductor device having a CMOS structure, said method comprising the steps of:

(a) selectively forming an isolation insulator film on a semiconductor substrate to define a first active region where a first MOSFET is formed and a second active region where a second MOSFET is formed;

(b) forming a gate insulator film on said first active region and said second active region;

(c) forming a first gate electrode and a second gate electrode on said gate insulator film, said first gate electrode being placed over said first active region and said second gate electrode being placed over said second active region;

(d) forming a first patterned photoresist film over said substrate, said first photoresist film having a first window that expose said first active region and a surrounding area of said first active region;

(e) selectively implanting first dopant ions of a first conductivity type into said substrate using said first photoresist film as a mask to form a first well region of said second conductivity type in said substrate, said first dopant ions penetrating through said first gate electrode and said gate insulator film into said first active region and through said isolation insulator film into said surrounding area of said first active region;

(f) selectively implanting second dopant ions of a second conductivity type into said substrate using said first photoresist film as a mask to form a first pair of source/drain regions of said second conductivity type in said first well region, said second dopant ions penetrating through said first well region and not penetrating through said isolation insulator film;

(g) forming a mask insulator film over said substrate by a selective growth using said patterned resist film as a mask, said mask insulator film having a second window that exposes said second active region and a surrounding area of said second active region;

(h) removing said patterned resist film after said step (g);

(i) selectively implanting third dopant ions of said second conductivity type into said substrate using said second conductivity type in said substrate, said third dopant ions penetrating through said second gate electrode and said gate insulator film into said second active region and through said isolation insulator film into said surrounding area of said second active region;

(j) selectively implanting fourth dopant ions of said first conductivity type into said second well region using said mask insulator film as a mask to form a second pair of source/drain regions of said first conductivity type in said second well region, said fourth dopant ions penetrating through said second gate electrode and said gate insulator film into said second well region and not penetrating through said isolation insulator film;

(k) removing said mask insulator film after said step (j);

(l) forming an interlayer insulator film to cover said first active region having said first pairs of source/drain regions and said second active region having said second pair of source/drain regions and said isolation insulator film;

(m) forming first contact holes that penetrate said interlayer insulator film and said underlying gate insulator film over said first active region;

(n) forming second contact holes that penetrate said interlayer insulator film and said interlying gate insulator film over said second active region;

(o) forming a third contact hole that penetrates said interlayer insulator film and said underlying isolation insulator film over said first well region;

(p) forming a fourth contact hole that penetrates said interlayer insulator film and said underlying isolation insulator film over said second well region; and (q) forming a patterned conductor film on said interlayer insulator film, said conductor film being contacted with said first pair of source/drain regions of said second conductivity type through said first contact holes, with said second pair of source/drain regions of said first conductivity type through said second contact holes, with said first well region through said third contact hole, and with said second well region through said fourth contact hole.

6. The method as claimed in claim 5, further comprising a step of selectively implanting fifth dopant ions of said first conductivity type into said first well region using said patterned resist film as a mask in order to adjust the threshold voltage of said first MOSFET; and a step of selectively implanting sixth dopant ions of said second conductivity type into said second well region using said mask insulator film as a mask in order to adjust the threshold voltage of said second MOSFET.

7. The method as claimed in claim 5, wherein said ion-implantation step (e) for forming said first well region and said ion-implantation step (i) for forming said second well region includes a dopant concentration of $1 \times 10^{17}$ atoms/cm$^3$ or greater at a surface area disposed right below said isolation oxide film.

8. The method as claimed in claim 5, wherein said conductor film is in Schottky contact with said first well region through said third contact hole and with said second well region through said fourth contact hole.

9. The method as claimed in claim 5, wherein said mask insulator film is made of $SiO_2$.

* * * * *